US007002400B2

(12) United States Patent
Koo (10) Patent No.: US 7,002,400 B2
(45) Date of Patent: Feb. 21, 2006

(54) INPUT CIRCUITS INCLUDING BOOSTED VOLTAGE AND RELATED METHODS

(75) Inventor: Kyoung-Hoi Koo, Gyeonggi-do (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 30 days.

(21) Appl. No.: 10/825,646

(22) Filed: Apr. 15, 2004

(65) Prior Publication Data

US 2004/0232946 A1    Nov. 25, 2004

(30) Foreign Application Priority Data

May 21, 2003  (KR)  ............... 10-2003-0032387

(51) Int. Cl.
*G05F 1/10* (2006.01)
*H03K 19/0175* (2006.01)

(52) U.S. Cl. .................. 327/536; 327/390; 326/81; 326/83

(58) Field of Classification Search ............ 326/68–81, 326/83, 112, 113, 119, 121; 327/333, 544, 327/566, 381, 536, 390

See application file for complete search history.

(56) References Cited

U.S. PATENT DOCUMENTS

| 5,828,538 | A  | * | 10/1998 | Apland et al. ............... 361/56 |
| 5,917,359 | A  | * | 6/1999 | Fukunaga et al. ........... 327/381 |
| 6,198,340 | B1 | * | 3/2001 | Ting et al. ................... 327/536 |
| 6,452,441 | B1 | * | 9/2002 | Kim et al. ................... 327/544 |
| 6,724,223 | B1 | * | 4/2004 | Ichiguchi et al. ............. 326/81 |
| 2002/0047740 | A1 | * | 4/2002 | Suzuki et al. ............... 327/333 |

* cited by examiner

*Primary Examiner*—Vibol Tan
(74) *Attorney, Agent, or Firm*—Myers Bigel Sibley & Sajovec (57) ABSTRACT

An input circuit for an integrated circuit device may include a boosting circuit, a protection circuit, and a buffer circuit. The boosting circuit is configured to receive a supply voltage of the integrated circuit device and to generate a boosted voltage higher than the supply voltage. The protection circuit is configured to receive an input signal and the boosted voltage and to generate an output signal that changes responsive to changes in the input signal. The buffer circuit is configured to generate a buffered output signal responsive to the output signal generated by the protection circuit. Related methods are also discussed.

Figure 9:
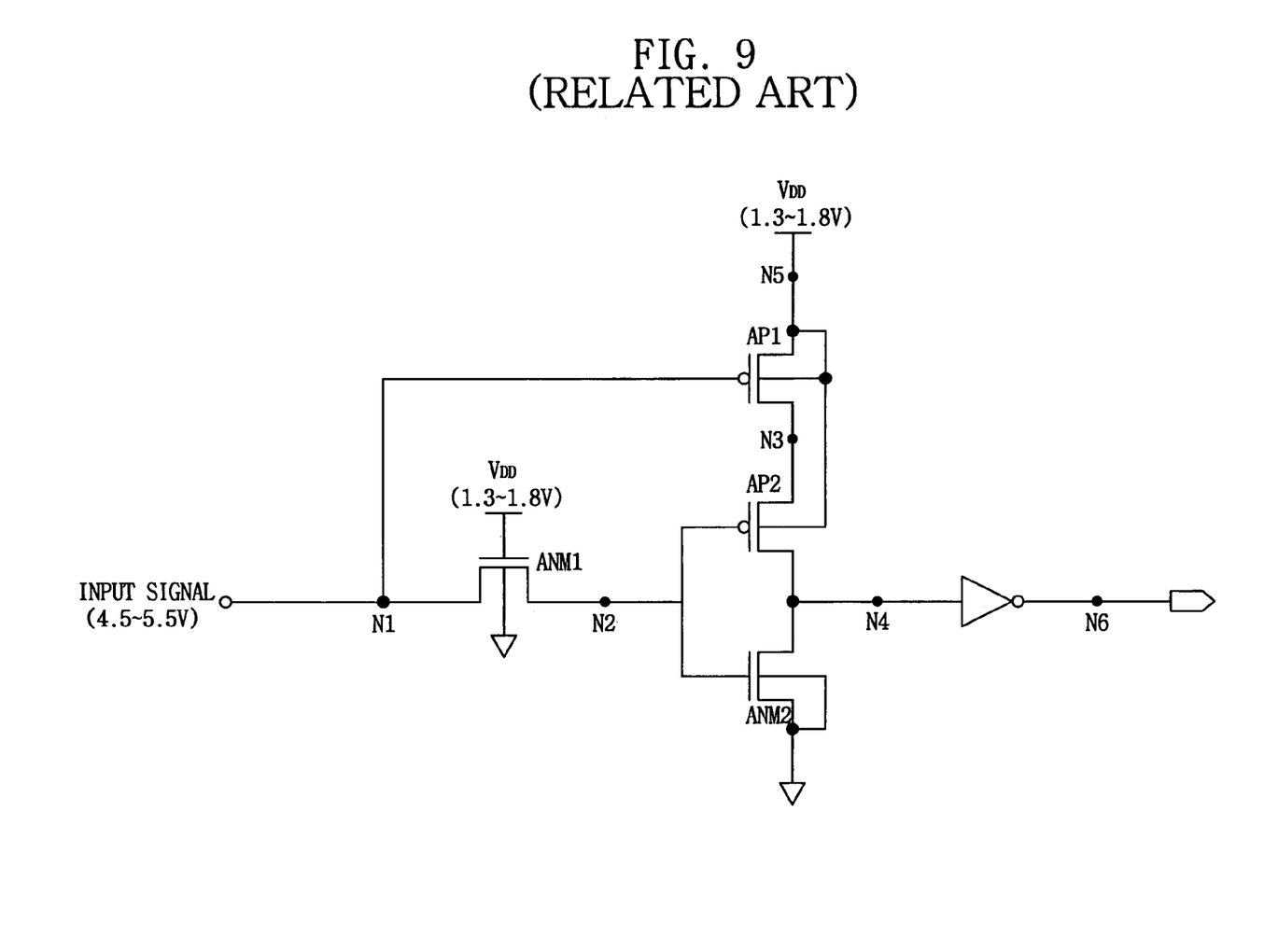
FIG. 9 is a circuit diagram showing a conventional tolerant input circuit.

28 Claims, 8 Drawing Sheets

ly lower than approximately 0.9 volts due to a body effect of the NMOS transistor ANM1. As a result, the NMOS transistor ANM2 as well as the PMOS transistor AP1 may be turned on. In other words, the tolerant input circuit may no longer perform switching operations. Therefore, the conventional tolerant input circuit may not be proper for a semiconductor input circuit that needs to tolerate an input voltage not less than approximately 4.5 volts when the supply voltage is less than approximately 2 volts.

US 7,002,400 B2

INPUT CIRCUITS INCLUDING BOOSTED VOLTAGE AND RELATED METHODS

CROSS-REFERENCE TO RELATED APPLICATIONS

This application claims priority from Korean Patent Application No. 2003-32387, filed on May 21, 2003, the contents of which are incorporated herein by reference in its entirety.

FIELD OF THE INVENTION

The present invention relates to the field of integrated circuits and more particularly to input circuits for integrated circuit devices and related methods.

BACKGROUND OF THE INVENTION

Semiconductor devices have become more highly integrated, power voltages for semiconductor devices have been reduced, and thicknesses of gate-oxide layers have been reduced. As a result, a semiconductor device having relatively thin gate-oxide structures may use power supply voltages less than 5 volts. Other semiconductor devices connected to an input of a low voltage device, however, may continue to use a 5 volt power supply. Accordingly, an integrated circuit device using a power supply less than 5 volts and capable of tolerating an input signal higher than 5 volts may be desired so that the integrated circuit device may interface with a semiconductor device having a 5 volt power voltage.

FIG. 9 is a block diagram illustrating a conventional tolerant input circuit. Referring FIG. 9, the conventional input tolerant circuit includes a first NMOS transistor ANM1, a second NMOS transistor ANM2, a first PMOS transistor AP1, a second PMOS transistor AP2 and a buffer.

As shown in FIG. 9, a supply voltage $V_{DD}$ is in a range between approximately 1.3 volts (V) to approximately 1.8 volts, and an input voltage is in a range between approximately 4.5 volts to approximately 5.5 volts. When the conventional tolerant input circuit includes 3 volt MOS transistors, the 3 volt MOS transistors may tolerate up to 3.6 volts without breakdown. In other words, a maximum tolerating (or withstanding) voltage of a 3 volt MOS transistor is approximately 3.6 volts. However, when the supply voltage is approximately 1.3 volts and the input voltage is approximately 5.5 volts, a voltage difference between a gate and a drain of the NMOS transistor ANM1 and a voltage difference between a gate and a drain of the PMOS transistor AP1 may be higher than approximately 3.6 volts. As a result, the NMOS transistor ANM1 and the PMOS transistor AP1 may breakdown.

A voltage of a second node AN2 is $(V_{DD}-V_{TH})$. $V_{TH}$ is referred to as a threshold voltage of the NMOS transistor ANM1. For example, when the threshold voltage $(V_{TH})$ is approximately 0.7 volts, the second node voltage is approximately 0.9 volts. The second node voltage may be lower than approximately 0.9 volts due to a body effect of the NMOS transistor ANM1. As a result, the NMOS transistor ANM2 as well as the PMOS transistor AP1 may be turned on. In other words, the tolerant input circuit may no longer perform switching operations. Therefore, the conventional tolerant input circuit may not be proper for a semiconductor input circuit that needs to tolerate an input voltage not less than approximately 4.5 volts when the supply voltage is less than approximately 2 volts.

SUMMARY OF THE INVENTION

According to embodiments of the present invention, an input circuit for an integrated circuit device includes a boosting circuit, a protection circuit, and a buffer circuit. The boosting circuit is configured to receive a supply voltage of the integrated circuit device and to generate a boosted voltage higher than the supply voltage. The protection circuit is configured to receive an input signal and the boosted voltage and to generate an output signal that changes responsive to changes in the input signal. The buffer circuit is configured to generate a buffered output signal responsive to the output signal generated by the protection circuit.

The protection circuit may be configured to generate a logic high voltage level output responsive to a logic high voltage level of the input signal and to generate a logic low voltage level output responsive to a logic low voltage level of the input signal, and the logic high voltage level output of the protection circuit may be less than a logic high voltage level of the input signal. More particularly, a logic high voltage level of the output signal may be less than a logic high voltage level of the input signal. Moreover, the protection circuit may include a MOS transistor having a gate coupled to the boosted voltage and a first source/drain coupled to the input signal. In addition, the output signal may be generated at a second source/drain of the MOS transistor, and a high voltage level of the output signal may be approximately a difference between the boosted voltage and a threshold voltage of the MOS transistor.

The boosting circuit may be configured to generate the boosted voltage having a voltage approximately two times higher than the supply voltage, and the boosting circuit may include a charge pump. The protection circuit may include a pass transistor having a control electrode coupled to the boosted voltage, an input electrode coupled to the input signal, and an output electrode. Moreover, the output signal may be generated at the output electrode, and the output signal may be approximately equal to a difference between the boosted voltage and a threshold voltage of the pass transistor.

The buffer circuit may include first and second serially coupled switching circuits. More particularly, the first switching circuit may invert the output signal generated by the protection circuit, and the second switching circuit may invert the output of the second switching circuit to generate the buffered output signal. The first switching circuit may include first and second transistors serially coupled between the supply voltage and ground, and the second switching circuit may include third and fourth transistors serially coupled between the supply voltage and ground. In addition, the third transistor may be a PMOS transistor having a gate electrically coupled to an output of the first switching circuit, and the fourth transistor may be an NMOS transistor having a gate electrically coupled to the output of the first switching circuit. Moreover, the fourth transistor may be electrically coupled in series between the third transistor and ground.

Similarly, the first transistor may be a PMOS transistor having a gate electrically coupled to an output of the protection circuit, and the second transistor may be an NMOS transistor having a gate electrically coupled to the output of the protection circuit. In addition, the second transistor may be electrically coupled in series between the first transistor and ground.

The boosting circuit may include a supply voltage boosting circuit configured to boost a level of the supply voltage and a supply voltage dropping circuit configured to drop a level of the supply voltage. The boosting circuit may be a charge pump.

According to particular embodiments, the boosting circuit may include first and second PMOS transistors, first and second NMOS transistors, and four capacitors. The first PMOS transistor is electrically coupled in series with the first NMOS transistor between the supply voltage and an output of the boosting circuit with the first NMOS transistor between the first PMOS transistor and the supply voltage. The second PMOS transistor is electrically coupled in series with a second NMOS transistor between the supply voltage and an output of the boosting circuit with the second NMOS transistor between the second PMOS transistor and the supply voltage. A first capacitor is coupled to the first and second PMOS transistors, a second capacitor is coupled to a source terminal of the first NMOS transistor and to a gate terminal of the second NMOS transistor, a third capacitor is coupled to a source terminal of the second NMOS transistor and to a gate terminal of the first NMOS transistor, and a fourth capacitor is coupled to the output of the boosting circuit.

The protection circuit may include a pass transistor having a gate coupled to the boosted voltage of the boosting circuit, a first source/drain coupled to the input signal, and a second source/drain coupled to the buffer circuit. More particularly, the pass transistor may be an NMOS transistor.

Moreover, a logic high voltage level of the input signal may be greater than approximately 4.5 volts, and the supply voltage of the integrated circuit device may be less than approximately 2 volts. Also, a logic high voltage level of the buffered output signal is less than approximately 2 volts. In addition, the buffer circuit may include two serially coupled inverters.

According to additional embodiments of the present invention, methods of receiving an input signal for an integrated circuit device may include generating a boosted voltage responsive to a supply voltage of the integrated circuit device wherein the boosted voltage is higher than the supply voltage. An output signal may be generated responsive to the boosted voltage and the input signal wherein the output signal changes responsive to changes in the input signal, and a buffered output signal may be generated responsive to the output signal.

More particularly, generating the output signal may include generating a logic high voltage level output responsive to a logic high voltage level of the input signal, and the logic high voltage level output of the protection circuit may be less than a logic high voltage level of the input signal. In addition, a logic low voltage level output may be generated responsive to a logic low voltage level of the input signal, and a logic high voltage level of the output signal may be less than a logic high voltage level of the input signal.

The boosted voltage may be generated to have a voltage approximately two times higher than the supply voltage, and the boosted voltage may be generated using a charge pump. Moreover, a logic high voltage level of the input signal may be greater than approximately 4.5 volts and the supply voltage of the integrated circuit device may be less than approximately 2 volts. In addition, generating the buffered output signal may include inverting the output signal twice, and a logic high voltage level of the buffered output signal may be less than approximately 2 volts.

The output signal may be generated using a transistor having a control electrode coupled to the boosted voltage, an input electrode coupled to the input signal, and an output electrode. Moreover, the output signal may be generated at the output electrode and the output signal may be approximately equal to a difference between the boosted voltage and a threshold voltage of the transistor.

According to embodiments of the present invention, input circuits and/or methods may be provided that tolerate relatively high input voltages using a relatively low power supply voltage.

According to embodiments of the present invention, input circuits and/or methods may be provided that tolerate relatively high input voltages (i.e. input voltages higher than a power supply voltage of the integrated circuit device). According to embodiments of the present invention, input circuits and/or methods may be capable of operating over a relatively wide range of low power supply voltages.

According to embodiments of the present invention, a tolerant input circuit may include a voltage supply section, a protection section, and a buffer. The voltage supply section is configured to receive a supply voltage via a first node to generate a second node voltage higher than the supply voltage. The protection section is configured to change a level of an input voltage using the second node voltage to generate a third node voltage having the changed level. The buffer is configured to buffer the third node voltage to generate a fourth node voltage lower than the input voltage.

According to additional embodiments of the present invention, a tolerant input circuit may include a voltage supply section, a protecting section, and a buffer. The voltage supply section is configured to boost a supply voltage to generate a second node voltage approximately two times higher than the supply voltage. The protecting section is configured to change a level of an input voltage using the second node voltage to generate a third node voltage. A level of the third node voltage corresponds to a difference between the second node voltage and a threshold voltage, with the input voltage being higher than the supply voltage. The buffer is configured to buffer the third node voltage to generate a fourth node voltage lower than the input voltage.

In still other embodiments of the present invention, a tolerant input circuit may include a voltage supply section, a protection section, a first switching section, and a second switching section. The voltage supply section is configured to change a level of a supply voltage using a charge pump circuit to generate a second node voltage approximately two times higher than the supply voltage. The protecting section is configured to change a level of an input voltage using a pass transistor to generate a third node voltage. The pass transistor is controlled by the second node voltage, with a level of the third node voltage corresponding to a difference between the second node voltage and a threshold voltage of the pass transistor. The first switching section is configured to pull up or pull down a fifth node in response to the third node voltage to generate a fifth node voltage having a first logic level opposite to a second logic level of the third node voltage. The second switching section is configured to pull up or pull down a fourth node in response to the fifth node voltage to generate a fourth node voltage, the fourth node voltage being lower than approximately 2 volts, a third logic level of the fourth node voltage being opposite to a fourth logic level of the fifth node voltage.

In yet other embodiments of the present invention, a tolerant input circuit may include a voltage changing section, and a buffer: The voltage changing section is configured to boost a supply voltage to generate a boosted voltage approximately two times higher than the supply voltage, and to change a level of an input voltage using a pass transistor to generate a third node voltage. The pass transistor is controlled by the boosted voltage, a level of the third node voltage corresponds to a difference between the boosted voltage and a threshold voltage of the pass transistor, with the supply voltage being lower than approximately 2 volts. The buffer is configured to buffer the third node signal to generate a fourth node signal lower than the input voltage.

In yet more embodiments of the present invention, a method of performing a tolerant input function may include generating a second node voltage higher than a supply voltage received via a first node. A level of an input voltage may be changed based on the second node voltage to generate a third node voltage having the changed level. A fourth node voltage lower than the input voltage may be generated based on the third node voltage.

In still other embodiments of the present invention, a method of performing a tolerant input function may include boosting a supply voltage to generate a boosted voltage approximately two times higher than the supply voltage. A level of an input voltage may be changed based on the second node voltage to generate a third node voltage corresponding to a difference between the boosted voltage and a threshold voltage, with the input voltage being higher than the supply voltage. A fourth node voltage lower than the input signal may be generated based on the third node signal.

In still other embodiments of the present invention, a method of performing a tolerant input function may include charge-pumping a supply voltage to boost the supply voltage and generate a second node voltage having a voltage two times higher than the supply voltage. A level of an input voltage may be changed to generate a third node voltage corresponding to a difference between the second node voltage and a threshold voltage, with the input voltage being higher than the supply voltage. A fifth node may be pulled up or pulled down in response to the third node voltage to generate a fifth node voltage having a first logic level opposite to a second logic level of the third node voltage. A fourth node may be pulled up or pulled down in response to the fifth node voltage to generate a fourth node voltage lower than approximately 2 volts, with the fourth node voltage having a third logic level opposite that of a fourth logic level of the fifth node voltage.

In still other embodiments of the present invention, a method of performing a tolerant input function may include charge-pumping a supply voltage lower than approximately 2 volts to boost the supply voltage and generate a second node voltage having a voltage two times higher than the supply voltage. A level of an input voltage may be changed to generate a third node voltage corresponding to a difference between the second node voltage and a threshold voltage based on the second node voltage. The third node may be buffered to generate a fourth node voltage lower the input voltage.

DETAILED DESCRIPTION

The present invention will be described more fully hereinafter with reference to the accompanying drawings, in which embodiments of the invention are shown. This invention, however, may be embodied in many different forms and should not be construed as limited to the embodiments set forth herein. Rather, these embodiments are provided so that this disclosure will be thorough and complete, and will fully convey the scope of the invention to those skilled in the art. It will also be understood that when an element is referred to as being "coupled" or "connected" to another element, it can be directly coupled or connected to the other element or intervening elements may also be present. In contrast, when an element is referred to as being "directly coupled" or "directly connected" to another element, there are no intervening elements present. Like numbers refer to like elements throughout.

Figure 1:
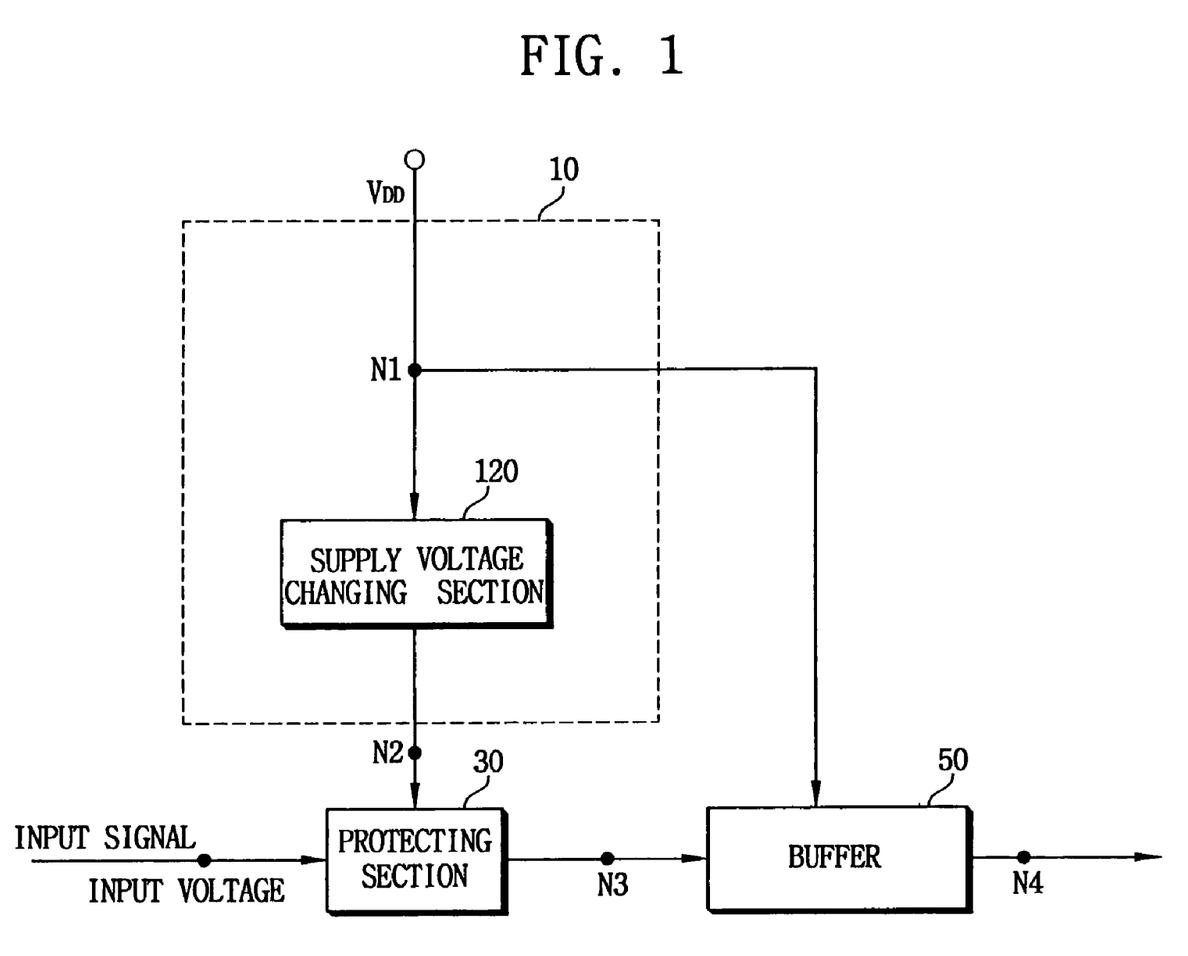
FIG. 1 is a block diagram illustrating tolerant input circuits according to embodiments of the present invention.

FIG. 1 is a block diagram illustrating a tolerant input circuit according to embodiments of the present invention. Referring to FIG. 1, the tolerant input circuit includes a voltage supply section 10, a protecting section 30, and a buffer 50. The voltage supply section 10 boosts a supply voltage $V_{DD}$, thereby generating a second node voltage at node N2 corresponding to the boosted supply voltage.

For example, the second node voltage may be approximately two times higher than the supply voltage $V_{DD}$. For example, the supply voltage $V_{DD}$ may be less than approximately 2 volts. More particularly, when the voltage supply $V_{DD}$ is approximately 1.5 volts, the second node voltage may be approximately 3 volts.

The protecting section 30 changes a voltage level of an input signal to generate a third node voltage at node N3 corresponding to the changed voltage level of the input signal. The third node voltage is low enough to protect circuit elements included in the buffer 50.

The buffer 50 generates a fourth node voltage at node N4 lower than the input voltage. In other words, the tolerant input circuit receives an input voltage higher than the supply voltage to generate the fourth node voltage lower than the input voltage.

For example, the input voltage may be higher than approximately 4.5 volts, and the resulting fourth node voltage may be lower than approximately 2 volts. The tolerant input circuit may boost the supply voltage to generate the boosted supply voltage at node N2 approximately two times higher than the supply voltage $V_{DD}$ at node N1, thereby protecting the protecting section 30 and the buffer 50.

As shown in FIG. 1, the voltage supply section 10 includes a supply voltage changing section 120. The supply voltage changing section 120 generates a second node voltage at node N2 higher than the supply voltage at node N1. The supply voltage changing section 120 may boost or drop a level of the supply voltage $V_{DD}$. For example, the supply voltage changing section 120 boosts the supply voltage to generate a boosted supply voltage at node N2 approximately two times higher than the supply voltage at node N1.

Figure 2:
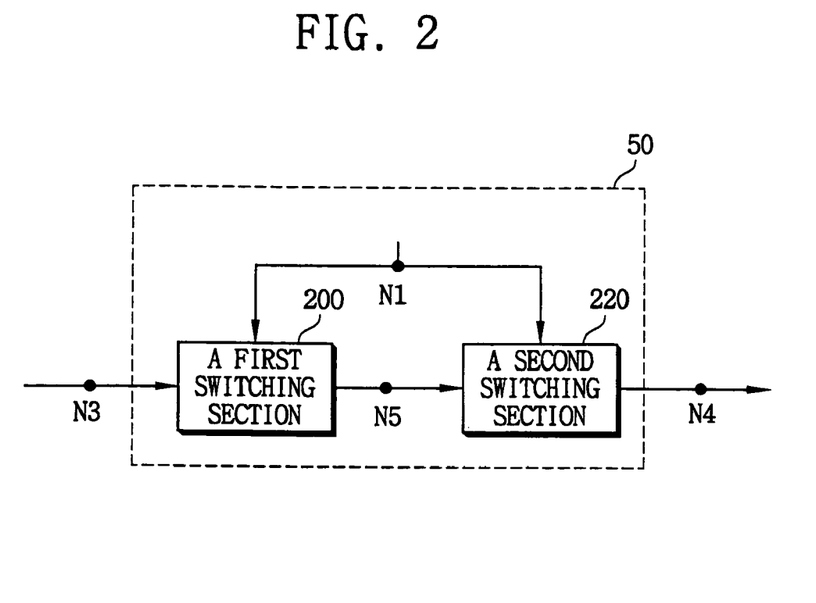
FIG. 2 is a block diagram illustrating buffers of FIG. 1 according embodiments of the present invention.

FIG. 2 is a block diagram illustrating a buffer of FIG. 1 according to embodiments of the present invention. Referring to FIG. 2, the buffer 50 includes a first switching section 200 and a second switching section 220.

The first switching section 200 generates a fifth node voltage at node N5 based on the third node voltage at node N3. The fifth node voltage has a logic level opposite to a logic level of the third node voltage. For example, when the logic level of the third node voltage is high, the logic level of the fifth node voltage is low, and when the logic level of the third node voltage is low, the logic level of the fifth node voltage is high. Accordingly, the first switching section 200 may include an inverter.

The second switching section 220 generates the fourth node voltage at node N4 using the fifth node voltage at node N5. A logic level of the fourth node voltage is opposite to a logic level of the fifth node voltage. For example, when the logic level of the fifth node voltage is high, the logic level of the fourth node voltage is low, and when the logic level of the fifth node voltage is low, the logic level of the fourth node voltage is high. Accordingly, the second switching section 220 according to embodiments of the present invention may include an inverter.

When the first switching section 200 includes an inverter and the second switching section 220 includes an inverter, the logic level of fourth node voltage at node N4 is the same as the logic level of the third node voltage at node N3. However, a voltage level of fourth node voltage may differ from a voltage level of the third node voltage.

Figure 3:
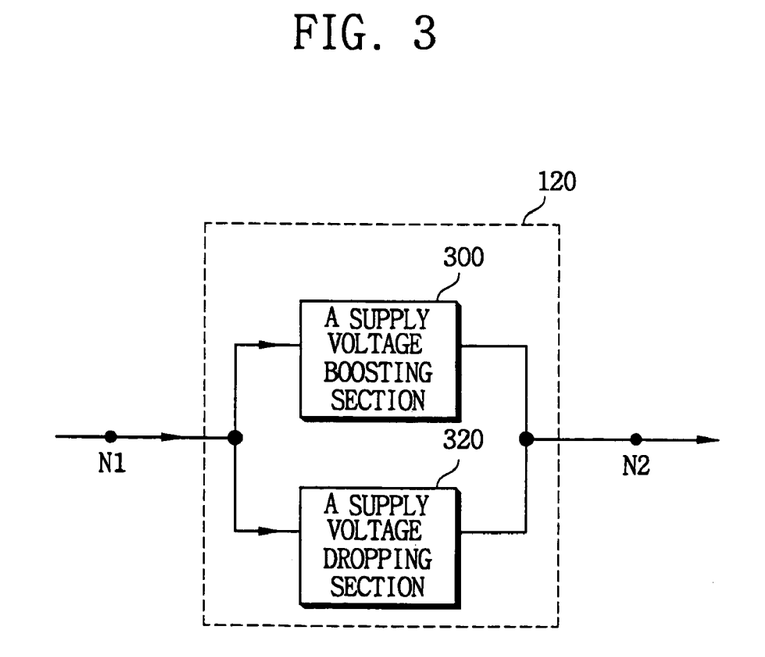
FIG. 3 is a block diagram illustrating supply voltage changing sections of FIG. 1 according to embodiments of the present invention.

FIG. 3 is a block diagram illustrating a supply voltage changing section of FIG. 1 according to embodiments of the present invention. Referring to FIG. 3, the supply voltage changing section 120 includes a supply voltage boosting section 300 and a supply voltage dropping section 320. The supply voltage boosting section 300 boosts the supply voltage. The supply voltage dropping section 320 drops the voltage level of the supply voltage.

For example, the supply voltage changing section 120 according to embodiments of the present invention may include the supply voltage boosting section 300 without the supply voltage dropping section 320. As a result, the second node voltage at node N2 may be higher than the supply voltage at node N1. The supply voltage boosting section 300 and the supply voltage dropping section 320 could both be included in the supply voltage changing section 120 with only one or the other operating at a time.

Figure 4:
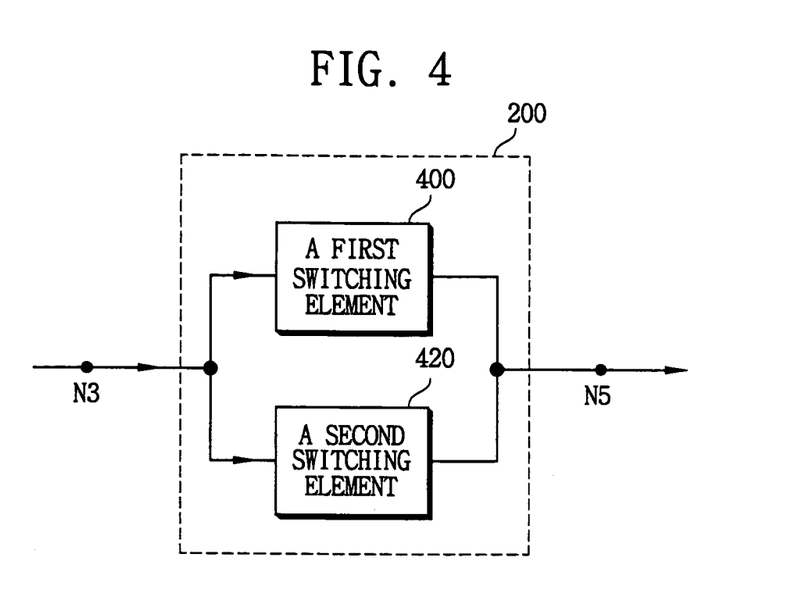
FIG. 4 is a block diagram illustrating first switching sections of FIG. 2 according to embodiments of the present invention.

FIG. 4 is a block diagram illustrating a first switching section of FIG. 2 according to embodiments of the present invention. Referring to FIG. 4, the first switching section 200 includes a first switching element 400 and a second switching element 420. The first switching element 400 is turned on/off in accordance with the third node voltage at node N3. The second switching element 420 is turned on/off in accordance with the third node voltage at node N3.

When the first switching element 400 is turned on, the second switching element 420 is turned off. When the first switching element 400 is turned off, the second switching element 420 is turned on. In other words, the first switching section 200 is a switching element.

The first switching element 400 is turned on when the logic level of the third node voltage is low, and is turned off when the logic level of the third node voltage is high. In other words, the first switching element 400 outputs a signal having high logic level when the logic level of the third node voltage is low, while the first switching element 400 does not output any signal (i.e. provides high impedance) when the logic level of the third node voltage is high. In addition, the second switching element 420 outputs a signal having a low logic level when the logic level of the third node voltage is high, while, the second switching element 420 does not output any signal (i.e. provides high impedance) when the logic level of the third node voltage is low.

Figure 5:
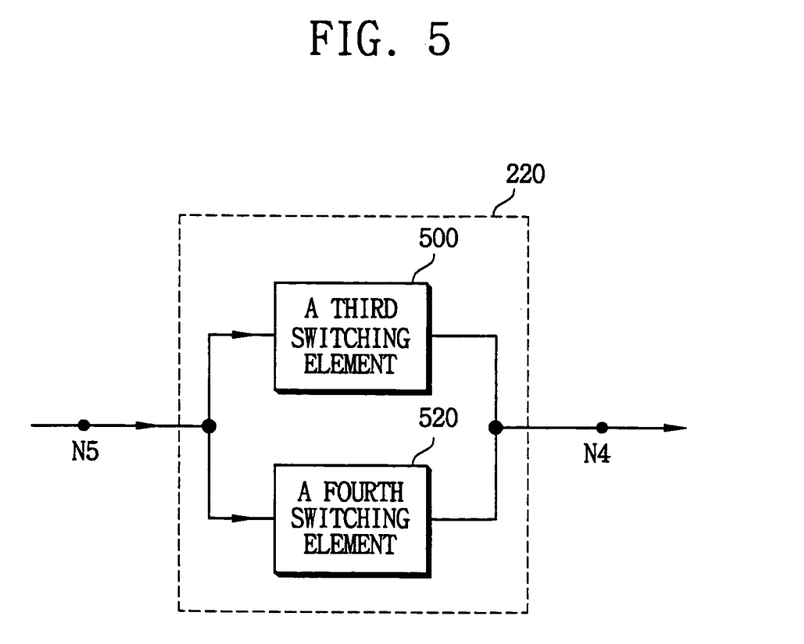
FIG. 5 is a block diagram illustrating second switching sections of FIG. 2 according to embodiments of the present invention.

FIG. 5 is a block diagram illustrating a second switching section of FIG. 2 according to embodiments of the present invention. Referring to FIG. 5, the second switching section 220 includes a third switching element 500 and a fourth switching element 520. The third switching element 500 is turned on/off in accordance with the fifth node voltage at node N5. The fourth switching element 520 is turned on/off in accordance with the fifth node voltage at node N5.

When the third switching element 500 is turned on, the fourth switching element 520 is turned off. When the third switching element 500 is turned off, the fourth switching element 520 is turned on. In other words, the second switching section 220 is a switching element.

The third switching element 500 is turned on when the logic level of the fifth node voltage is low, and is turned off when the logic level of the fifth node voltage is high. In other words, the third switching element 500 outputs a signal having a high logic level when the logic level of the fifth node voltage is low, while the third switching element 500 does not output any signal (i.e. provides a high impedance) when the logic level of the fifth node voltage is high. In addition, the fourth switching element 520 outputs a signal having a low logic level when the logic level of the fifth node voltage is high, while the fourth switching element 520 does not output any signal (i.e. provides a high impedance) when the logic level of the fifth node voltage is low.

Figure 6A:
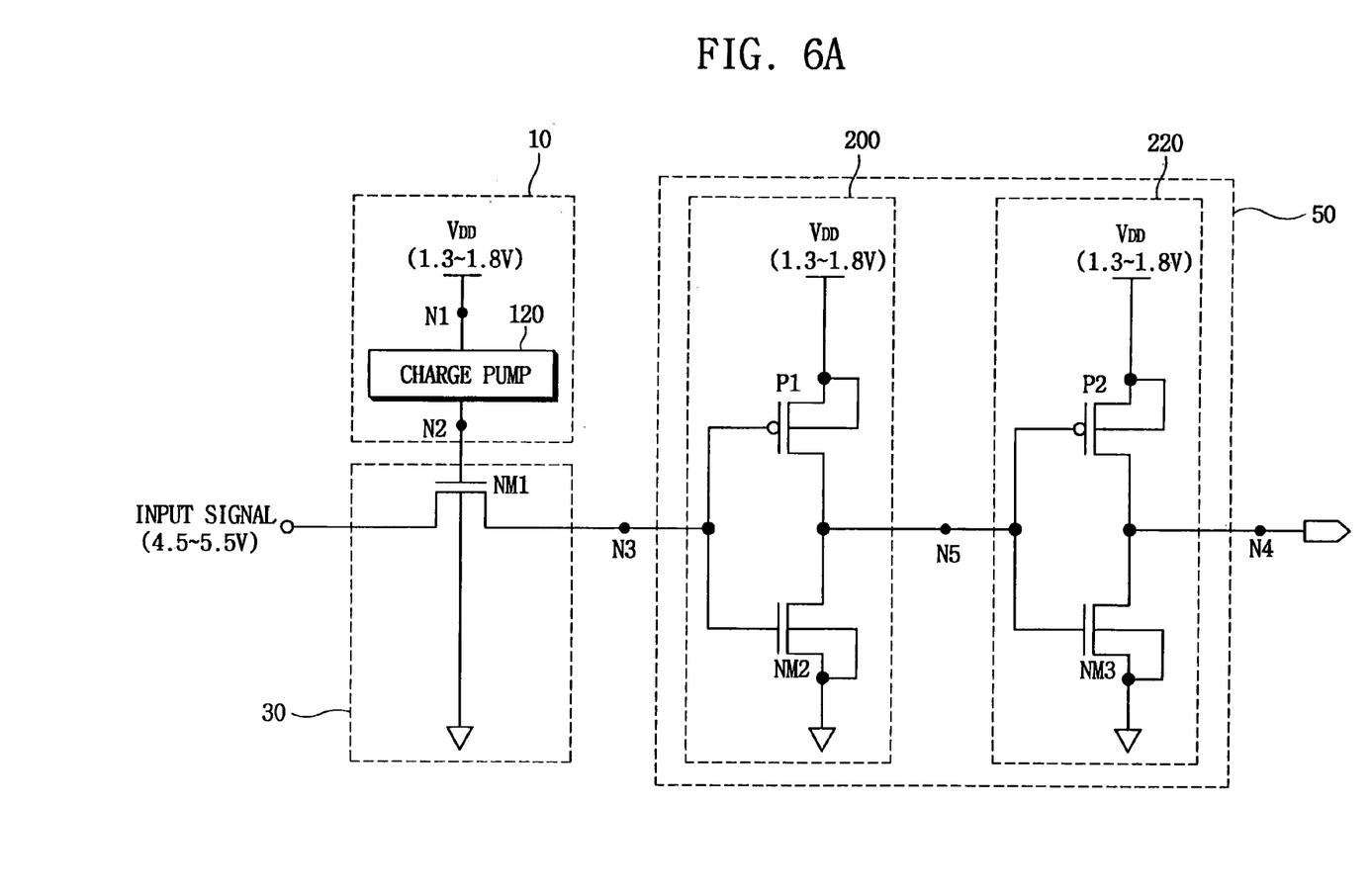
FIG. 6A is a circuit diagram showing tolerant input circuits according to second embodiments of the present invention.

FIG. 6A is a circuit diagram showing a tolerant input circuit according to embodiments of the present invention. Referring to FIG. 6A, the tolerant input circuit includes the supply voltage changing section 120 implemented as a charge pump, a first NMOS transistor (hereafter, referred to as "NM1 MOS transistor"), a second NMOS transistor (hereafter, referred to as "NM2 MOS transistor"), a third NMOS transistor (hereafter, referred to as "NM3 MOS transistor"), a first PMOS transistor (hereafter, referred to as "P1 MOS transistor") and a second PMOS transistor (hereafter, referred to as "P2 MOS transistor").

The supply voltage changing section 120 will be described in detail with reference to FIG. 7.

The protecting section 30 includes the NM1 MOS transistor. A gate terminal of the NM1 MOS transistor is coupled to the second node N2. In addition, a bulk (body) of the NM1 MOS transistor is coupled to a ground.

Hereinafter, examples are discussed wherein the supply voltage ($V_{DD}$) is approximately 1.5 volts, and the input voltage is approximately 5.5 volts. For example, the threshold voltage ($V_{TH}$) may be approximately 0.7 volts, and the MOS transistors may be capable of tolerating a maximum voltage of approximately 3.6 volts without causing breakdown.

Accordingly, the second node voltage at node N2 may be approximately 3 volts ($2 \times V_{DD}$). Because the second node voltage and a voltage of the bulk are 3 volts and 0 volts, respectively, a voltage difference between the gate and the bulk of the NM1 MOS transistor is approximately 3 volts. Since the voltage difference between the gate and the bulk of the NM1 MOS transistor is higher than the threshold voltage ($V_{TH}$), the NM1 MOS transistor is always turned on. In this case, the threshold voltage ($V_{TH}$) may be increased due to a body effect. Hereafter, a threshold voltage ($V_{TH}$) may be assumed to increase to approximately 0.9 volts due to a body effect.

When an input signal of approximately 5 volts is input to a drain terminal of the NM1 MOS transistor, the third node voltage at node N3 may be approximately equal to the second node voltage N2 minus the threshold voltage ($V_{TH}$). Therefore, the voltage at the third node NC may be approximately equal to $2\times V_{DD}-V_{TH}$. In other words, the voltage at the third node N3 may be approximately 2.1 volts. When the tolerant input circuit does not include the NM1 MOS transistor, voltage differences between terminals of the P1 MOS transistor may be higher than 3.6 volts, and the P1 MOS transistor may breakdown. In addition, voltage differences between terminals of the NM2 MOS transistor may be higher than 3.6 volts, and the NM2 MOS transistor may breakdown. When the NM1 MOS transistor is coupled between an input node, via which the input voltage is input, and the third node N3, voltage differences between terminals of the P1 MOS transistor and between terminals of the NM2 MOS transistors may be lower than 3.6 volts. Therefore, the P1 MOS transistor and the NM2 MOS transistor may be less likely to breakdown.

In tolerant input circuits according to embodiments of the present invention, the supply voltage $V_{DD}$ is boosted so that a voltage difference between the gate and drain of the NM1 MOS transistor is less than 3.6 volts. Therefore, the NM1 MOS transistor may function without breakdown.

The NM1 MOS transistor according to embodiments of the present invention may provide functionality of a pass transistor. In other words, the protecting section 30 according to embodiments of the present invention may include a pass transistor.

The first switching section 200 includes the P1 MOS transistor and the NM2 MOS transistor. The gate of P1 MOS transistor is coupled to the third node N3, and the NM2 MOS transistor is coupled between the P1 MOS transistor and ground.

Because a voltage difference between gate and source of the P1 MOS transistor is lower than the threshold voltage ($V_{TH}$), the P1 MOS transistor is turned off when the input voltage and the voltage at node N3 are at a logic high. Because a voltage difference between gate and source of the NM2 MOS transistor is higher than the threshold voltage ($V_{TH}$), the NM2 MOS transistor is turned on when the input voltage and the voltage at node N3 are at a logic high. When the first switching section 200 receives a signal having a high logic level at node N3, the first switching section 200 generates a signal having a low logic level at node N5. Therefore, when the input voltage is approximately 5 volts, the logic level at the third node N3 is high, and the logic level of the fifth node N5 is low. In other words, the NM2 MOS transistor pulls the fifth node N5 down, thereby generating a signal having a low logic level at node N5.

When the logic level of the third node N3 is low, the P1 MOS transistor is turned on, and the NM2 MOS transistor is turned off. When the first switching section 200 receives a signal having a low logic level at node N3, and the first switching section generates a signal having a high logic level at node N5. In other words, the P1 MOS transistor pulls the fifth node N5 up, thereby generating a signal having a high logic level at node N5.

As described above, the first switching section 200 according to embodiments of the present invention may provide functionality of an inverter.

In the input circuit shown in FIG. 9, a voltage of a second node N2 may be $V_{DD}-V_{TH}$. In a tolerant input circuit according to embodiments of the present invention, the voltage at the third node N3 may be $2\times V_{DD}-V_{TH}$. Therefore, the P1 MOS transistor is not turned on when the input voltage is approximately 5 volts. As a result, the tolerant input circuit of FIG. 6A does not require an additional PMOS transistor between the P1 MOS transistor and $V_{DD}$ for cutting off the P1 MOS transistor.

The second switching section 220 includes the P2 MOS transistor and the NM3 MOS transistor. The gate of P2 MOS transistor is coupled to the fifth node N5, and the NM3 MOS transistor is coupled between the P2 MOS transistor and ground.

Because a voltage difference between the gate and source of the P2 MOS transistor is higher than the threshold voltage ($V_{TH}$) when the logic level at node N5 is low, the P2 MOS transistor is turned on when the logic level at node N5 is low. Because voltage difference between gate and source of the NM3 MOS transistor is lower than the threshold voltage ($V_{TH}$) when the logic level at node N5 is low, the NM3 MOS transistor is turned off when the logic level of node N5 is low. Therefore, when the input voltage is approximately 5 volts, the logic level at the fifth node N5 is low, and the logic level at the fourth node N4 is high. In other words, the P2 MOS transistor pulls the fourth node N4 up, thereby generating a signal having a high logic level.

When the logic level at the fifth node N5 is high, the P2 MOS transistor is turned off, and the NM3 MOS transistor is turned on. Therefore, when the logic level at the fifth node N5 is high, the logic level at the fourth node N4 is low. In other words, the NM3 MOS transistor pulls the fourth node N4 down, thereby generating a signal at node N4 having a low logic level.

As described above, the second switching section 220 according to embodiments of the present invention may provide functionality of an inverter.

Because the first switching section 200 and the second switching section 220 are both inverters, the buffer 50 is non-inverting.

Figure 6B:
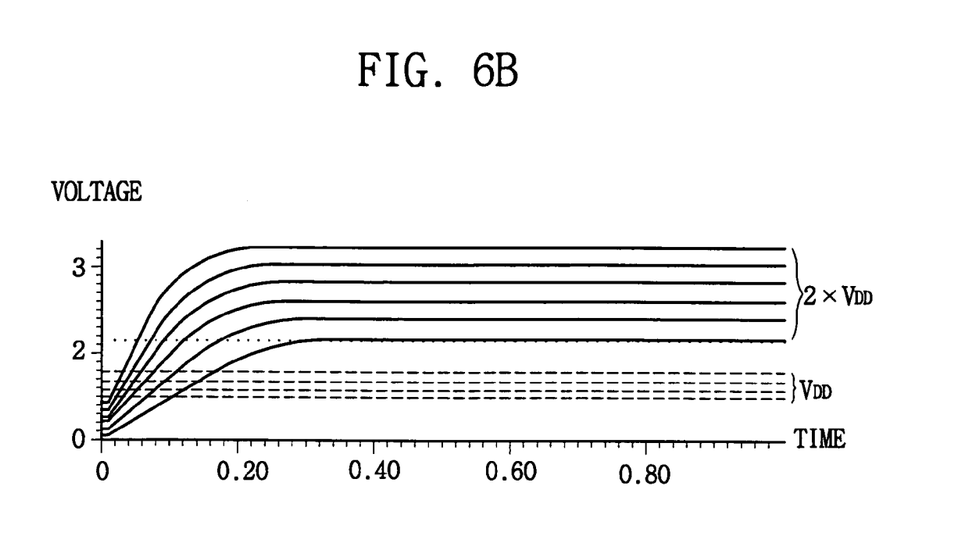
FIG. 6B is a graph showing supply voltages and second node voltages of FIG. 6A according to embodiments of the present invention.

FIG. 6B is a graph showing a supply voltage and a second node voltage at node N2 of FIG. 6A according to embodiments of the present invention. Referring to FIG. 6B, a supply voltage $V_{DD}$ is in a range between approximately 1.3 volts to approximately 1.8 volts. A second node voltage at node N2 is in a range between approximately 2.6 volts to approximately 3.6 volts. In other words, the supply voltage changing section 120 boosts the supply voltage $V_{DD}$ to generate the second node voltage at node N2 approximately two times higher than the supply voltage $V_{DD}$.

Figure 6C:
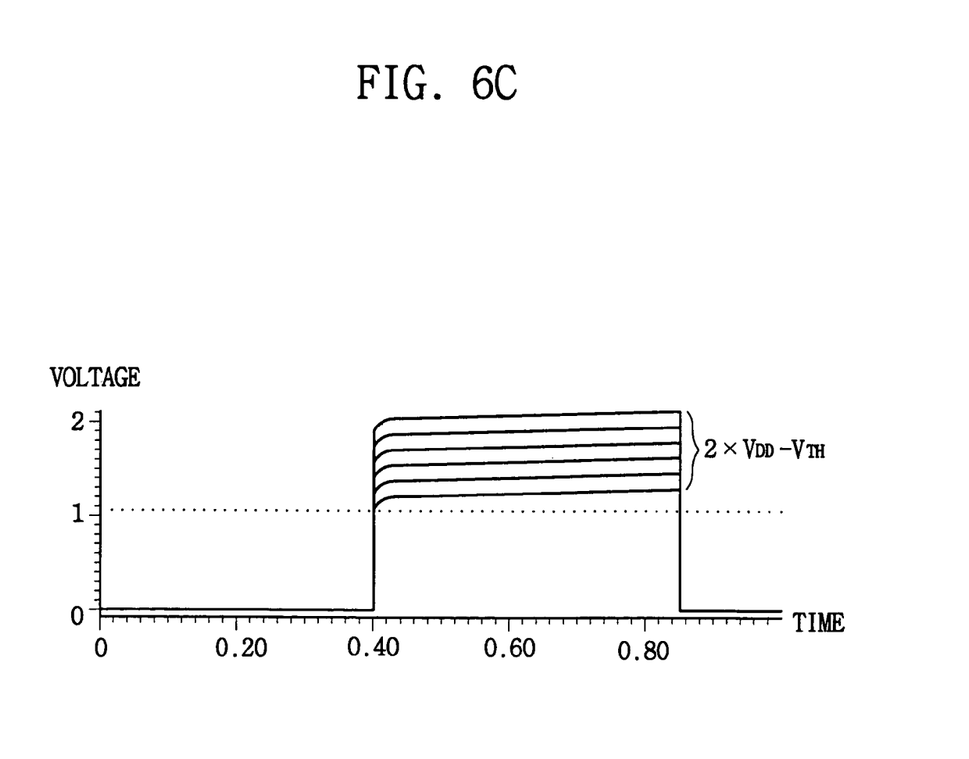
FIG. 6C is a graph showing third node voltages of FIG. 6A according embodiments of the present invention.

FIG. 6C is a graph showing a third node voltage at node N3 of FIG. 6A according to embodiments of the present invention. Referring to FIG. 6C, the third node voltage at node N3 is $2\times V_{DD}-V_{TH}$. In other words, the third node voltage at node N3 may be boosted compared with the voltage at a similar node of a conventional input circuit.

Figure 7:
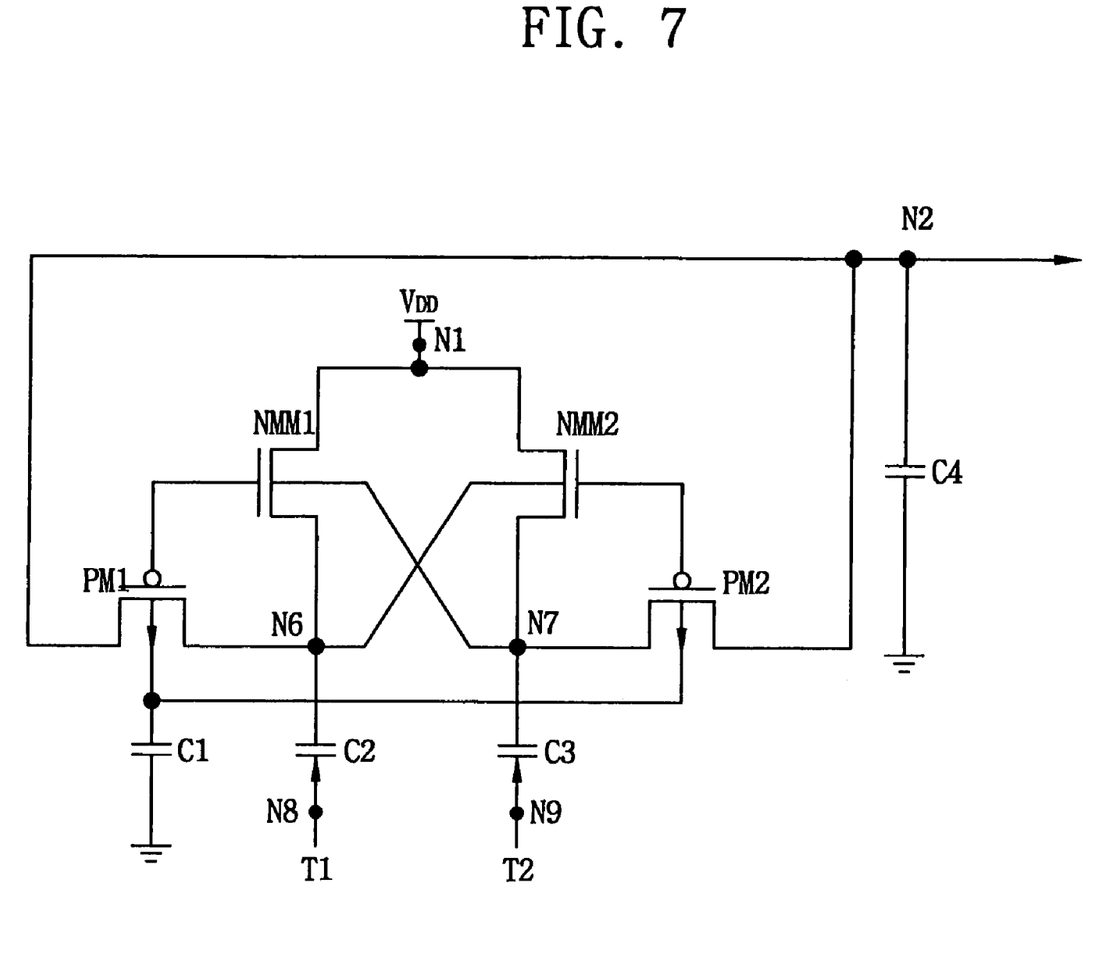
FIG. 7 is a circuit diagram showing charge pumps of FIG. 6A according to embodiments of the present invention.

FIG. 7 is a circuit diagram showing a charge pump of FIG. 6A according to embodiments of the present invention.

Referring to FIG. 7, the supply voltage changing section 120 may include a first NMOS transistor (hereinafter, referred to as "NMM1 MOS transistor"), a second NMOS transistor (hereinafter, referred to as "NMM2 MOS transistor"), a first PMOS transistor (hereinafter, referred to as "PM1 MOS transistor"), a second PMOS transistor (hereinafter, referred to as "PM2 MOS transistor"), a first capacitor (C1), a second capacitor (C2), a third capacitor (C3) and a fourth capacitor (C4). The PM1 MOS transistor is coupled to the second node N2, and the NMM1 MOS transistor is coupled between the PM1 MOS transistor and the first node N1. The NMM2 MOS transistor is coupled to the first node N1, and is coupled to the NMM1 MOS transistor. The PM2 MOS transistor is coupled to the NMM2 MOS transistor. The first capacitor (C1) is coupled to a bulk of the PM1 transistor and a bulk of the PM2 MOS transistor. The second capacitor (C2) is coupled to a source terminal of the NM1 MOS transistor and a gate terminal of the NM2 MOS transistor. The third capacitor (C3) is coupled to a source terminal of the NMM2 MOS transistor and a gate terminal of the NMM1 MOS transistor. The fourth capacitor (C4) is coupled to both of the PM1 and PM2 MOS transistors. A second clock signal (T2) has an inverted phase with respect to a first clock signal (T1). Therefore, when the logic level of the first clock signal is high, the logic level of the second clock signal is low.

Under an assumption that the logic level of the first clock signal changes from a low logic level to a high logic level, the logic level of the second clock signal changes from high to low. In an initial condition, sixth and seventh nodes N6 and N7 are both charged with the supply voltage $V_{DD}$. When the logic level of the first clock signal is changed from low to high, the NM1 MOS transistor and the PM2 MOS transistor are turned off, and the NMM2 MOS transistor and the PM1 MOS transistor are turned on. While the logic level of the first clock signal is changed from low to high, a voltage at the sixth node N16 is changed from $V_{DD}$ to $2 \times V_{DD}$. In other words, because a voltage of an eighth node (N8) is changed from 0 volts to $V_{DD}$, a voltage between both terminals of the second capacitor (C2) is changed to $2 \times V_{DD}$. Because the PM1 MOS transistor is turned on, voltage of the sixth node ($2 \times V_{DD}$) is charged to the fourth capacitor (C4). In addition, because the NM2 MOS transistor is turned on, a voltage of the seventh node N7 remains at $V_{DD}$.

When the logic level of the first clock signal T1 is changed from high to low, the NMM1 MOS transistor and the PM2 MOS transistor are turned on, and the NMM2 MOS transistor and the PM1 MOS transistor are turned off. Therefore, the voltage of the seventh node N7 is changed to $2 \times V_{DD}$, and the voltage of the sixth node N6 is maintained at $V_{DD}$. Because the PM2 MOS transistor is turned on, voltage at the seventh node N7 ($2 \times V_{DD}$) is charged to the fourth capacitor (C4).

As described above, irrespective of the logic level of the first clock signal T1, the voltage of the second node is $2 \times V_{DD}$. The first capacitor reduces a possibility of latch-up. Latch-up indicates a phenomenon in which a relatively large current is passed through the PM1 and PM2 MOS transistors so that the PM1 and PM2 MOS transistors breakdown.

Figure 8:
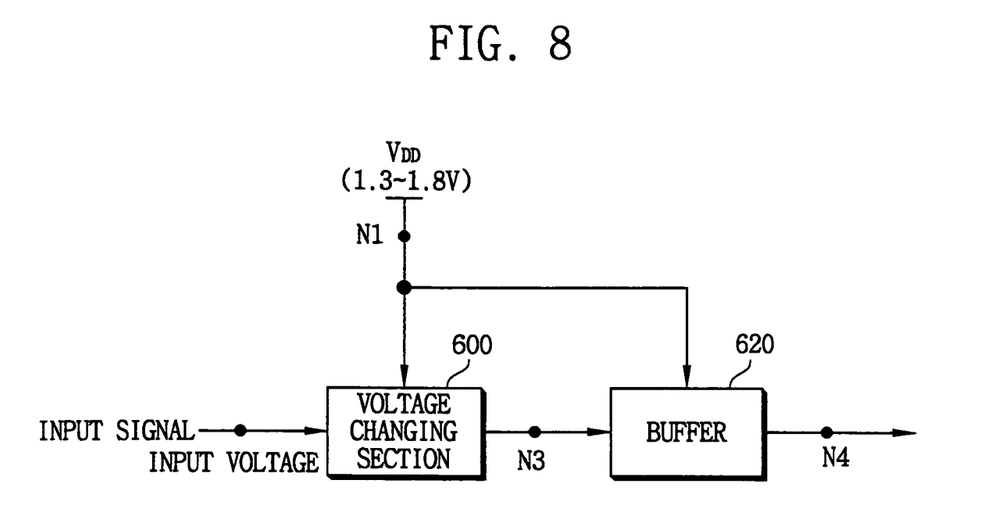
FIG. 8 is a block diagram illustrating tolerant input circuits according to embodiments of the present invention.

FIG. 8 is a block diagram illustrating a tolerant input circuit according to additional embodiments of the present invention. Referring to FIG. 8, the tolerant input circuit includes a voltage changing section 600 and a buffer 620.

The voltage changing section 600 boosts the supply voltage to generate a boosted supply voltage approximately two times higher than the supply voltage. The voltage changing section 600 changes a level of an input voltage to a voltage level of (the boosted supply voltage—a threshold voltage ($V_{TH}$)) using a pass transistor controlled by the boosted voltage supply, and generates a third node voltage at node N3 having the changed voltage level of the input voltage. For example, the supply voltage $V_{DD}$ may be in a range between approximately 1.3 volts to approximately 1.8 volts.

The buffer 620 buffers the third node voltage at node N3 to generate a fourth node voltage at node N4 lower than the input voltage. As described above, the tolerant input circuit may tolerate an input voltage higher than approximately 4.5 volts using a supply voltage $V_{DD}$ lower than approximately 2 volts.

In addition, because the tolerant input circuit tolerates the input voltage using a boosted supply voltage, the tolerant input circuit may reduce breakdown of other circuit elements.

Moreover, because the tolerant input circuit tolerates the input voltage using a boosted supply voltage, the tolerant input circuit may stably operate without an additional circuit element.

While the present invention has been particularly shown and described with reference to embodiments thereof, it will be understood by those skilled in the art that various changes in form and details may be made therein without departing from the spirit and scope of the invention as defined by the appended claims and their equivalents.

What is claimed is:

1. An input circuit for an integrated circuit device, the input circuit comprising:
    a boosting circuit configured to receive a supply voltage of the integrated circuit device and to generate a boosted voltage higher than the supply voltage;
    a protection circuit configured to receive an input signal and the boosted voltage and to generate an output signal that changes responsive to changes in the input signal wherein the protection circuit is configured to generate a logic high voltage level output responsive to a logic high voltage level of the input signal, wherein the protection circuit is configured to generate a logic low voltage level output responsive to a logic low voltage level of the input signal, and wherein the logic high voltage level output of the protection circuit is less than the logic high voltage level of the input signal; and
    a buffer circuit configured to generate a buffered output signal responsive to the output signal generated by the protection circuit wherein a logic high voltage level of the buffered output signal is less than a logic high voltage level of the input signal.

2. The input circuit according to claim 1 wherein the protection circuit comprises a MOS transistor having a gate coupled to the boosted voltage and a first source/drain coupled to the input signal, wherein the output signal is generated at a second source/drain of the MOS transistor, and wherein high voltage level of the output signal is approximately a difference between the boosted voltage and a threshold voltage of the MOS transistor.

3. The input circuit according to claim 1 wherein the boosting circuit is configured to generate the boosted voltage having a voltage approximately two times higher than the supply voltage.

4. The input circuit according to claim 1 wherein the boosting circuit comprises a charge pump.

5. The input circuit according to claim 1 wherein the protection circuit comprises a pass transistor having a control electrode coupled to the boosted voltage, an input electrode coupled to the input signal, and an output electrode, wherein the output signal is generated at the output electrode and wherein the output signal is approximately equal to a difference between the boosted voltage and a threshold voltage of the pass transistor.

6. The input circuit according to claim 1 wherein the buffer circuit includes first and second serially coupled switching circuits, wherein the first switching circuit inverts the output signal generated by the protection circuit and wherein the second switching circuit inverts the output of the first switching circuit to generate the buffered output signal wherein the logic high voltage level of the buffered output signal is less than the logic high voltage level of the input signal.

7. The input circuit according to claim 6 wherein the first switching circuit comprises first and second transistors serially coupled between the supply voltage and ground.

8. The input circuit according to claim 7 wherein the second switching circuit comprises third and fourth transistors serially coupled between the supply voltage and ground.

9. The input circuit according to claim 8 wherein the third transistor comprises a PMOS transistor having a gate electrically coupled to an output of the first switching circuit.

10. The input circuit according to claim 9 wherein the fourth transistor comprises an NMOS transistor having a gate electrically coupled to the output of the first switching circuit and wherein the fourth transistor is electrically coupled in series between the third transistor and ground.

11. The input circuit according to claim 7 wherein the first transistor comprises a PMOS transistor having a gate electrically coupled to an output of the protection circuit.

12. The input circuit according to claim 11 wherein the second transistor comprises an NMOS transistor having a gate electrically coupled to the output of the protection circuit and wherein the second transistor is electrically coupled in series between the first transistor and ground.

13. The input circuit according to claim 1 wherein the protection circuit comprises a pass transistor having a gate coupled to the boosted voltage of the boosting circuit, a first source/drain coupled to the input signal, and a second source/drain coupled to the buffer circuit.

14. The input circuit according to claim 13 wherein the pass transistor comprises an NMOS transistor.

15. The input circuit according to claim 1 wherein a logic high voltage level of the input signal is greater than approximately 4.5 volts and wherein the supply voltage of the integrated circuit device is less than approximately 2 volts.

16. The input circuit according to claim 1 wherein the buffer circuit comprises two serially coupled inverters.

17. The input circuit according to claim 1 wherein a logic high voltage level of the buffered output signal is less than approximately 2 volts.

18. The input circuit according to claim 1 wherein the boosting circuit, the protection circuit, and the buffer circuit are provided on a first integrated circuit device, and wherein the protection circuit receives the input signal from a second integrated circuit device separate from the first integrated circuit device.

19. An input circuit for an integrated circuit device, the input circuit comprising:
a boosting circuit configured to receive a supply voltage of the integrated circuit device and to generate a boosted voltage higher than the supply voltage;
a protection circuit configured to receive an input signal and the boosted voltage and to generate an output signal that changes responsive to changes in the input signal; and
a buffer circuit configured to generate a buffered output signal responsive to the output signal generated by the protection circuit;
wherein the boosting circuit includes a supply voltage boosting circuit configured to boost a level of the supply voltage and a supply voltage dropping circuit configured to drop a level of the supply voltage.

20. An input circuit for an integrated circuit device, the input circuit comprising:
a boosting circuit configured to receive a supply voltage of the integrated circuit device and to generate a boosted voltage higher than the supply voltage;
a protection circuit configured to receive an input signal and the boosted voltage and to generate an output signal that changes responsive to changes in the input signal; and
a buffer circuit configured to generate a buffered output signal responsive to the output signal generated by the protection circuit;
wherein the boosting circuit comprises,
a first PMOS transistor electrically coupled in series with a first NMOS transistor between the supply voltage and an output of the boosting circuit wherein the first NMOS transistor is between the first PMOS transistor and the supply voltage,
a second PMOS transistor electrically coupled in series with a second NMOS transistor between the supply voltage and an output of the boosting circuit wherein the second NMOS transistor is between the second PMOS transistor and the supply voltage,
a first capacitor coupled to a bulk of the first and second PMOS transistors,
a second capacitor coupled to a source terminal of the first NMOS transistor and to a gate terminal of the second NMOS transistor,
a third capacitor coupled to a source terminal of the second NMOS transistor and to a gate terminal of the first NMOS transistor, and
a fourth capacitor coupled to the output of the boosting circuit.

21. A method of receiving an input signal for an integrated circuit device, the method comprising:
generating a boosted voltage responsive to a supply voltage of the integrated circuit device wherein the boosted voltage is higher than the supply voltage;
generating an output signal responsive to the boosted voltage and the input signal wherein the output signal changes responsive to changes in the input signal wherein generating the output signal comprises generating a logic high voltage level output responsive to a logic high voltage level of the input signal wherein the logic high voltage level output is less than the logic high voltage level of the input signal and generating a logic low voltage level output responsive to a logic low voltage level of the input signal; and
generating a buffered output signal responsive to the output signal wherein a logic high voltage level of the buffered output signal is less than a logic high voltage level of the input signal.

22. The method according to claim 21 wherein generating the boosted voltage responsive to the supply voltage comprises generating the boosted voltage to have a voltage approximately two times higher than the supply voltage.

23. The method according to claim 21 wherein generating the boosted voltage comprises generating the boosted voltage using a charge pump.

24. The method according to claim 21 wherein a logic high voltage level of the input signal is greater than approximately 4.5 volts and wherein the supply voltage of the integrated circuit device is less than approximately 2 volts.

25. The method according to claim 21 wherein generating the buffered output signal comprises inverting the output signal twice.

26. The method according to claim 21 wherein a logic high voltage level of the buffered output signal is less than approximately 2 volts.

27. The method according to claim 21 wherein generating the output signal comprises generating the output signal using a transistor having a control electrode coupled to the boosted voltage, an input electrode coupled to the input signal, and an output electrode, wherein the output signal is generated at the output electrode and wherein the output signal is approximately equal to a difference between the boosted voltage and a threshold voltage of the transistor.

28. The method according to claim 21 wherein the boosted voltage, the output signal, and the buffered output signal are generated on a first integrated circuit device, and wherein the input signal is received from a second integrated circuit device separate from the first integrated circuit device.

* * * * *